United States Patent [19]

Besik

[11] Patent Number: 4,909,307

[45] Date of Patent: Mar. 20, 1990

[54] REGENERATIVE BED HEAT EXCHANGER

[75] Inventor: Ferdinand K. Besik, Mississauga, Canada

[73] Assignee: Canadian Gas Research Institute, Don Mills, Canada

[21] Appl. No.: 148,314

[22] Filed: Jan. 25, 1988

Related U.S. Application Data

[63] Continuation-in-part of Ser. No. 25,428, Mar. 13, 1987, Pat. No. 4,708,000.

[30] Foreign Application Priority Data

Jun. 30, 1987 [CA] Canada .................................. 541004

[51] Int. Cl.⁴ ...................... F28D 17/00; F28D 17/02
[52] U.S. Cl. ........................................... 165/4; 165/7; 165/10; 137/309
[58] Field of Search ................. 165/4, 7, 10; 137/309, 137/310, 311

[56] References Cited

U.S. PATENT DOCUMENTS

| | | | |
|---|---|---|---|
| Re. 17,577 | 2/1930 | Dryssen | 165/4 |
| 634,907 | 10/1899 | Newell | 137/309 |
| 1,845,239 | 2/1932 | Colby | 165/4 |
| 2,272,108 | 2/1942 | Bradley | 165/4 |
| 2,735,278 | 2/1956 | Rice | 165/4 |
| 3,368,327 | 2/1968 | Munters | 165/4 |
| 4,227,375 | 10/1980 | Thompkins | 165/4 |

FOREIGN PATENT DOCUMENTS

| | | | |
|---|---|---|---|
| 1373034 | 8/1964 | France | 165/4 |
| 1077132 | 7/1967 | United Kingdom | 165/4 |

Primary Examiner—Albert W. Davis, Jr.
Attorney, Agent, or Firm—Rogers, Bereskin & Parr

[57] ABSTRACT

A heat exchanger has two regenerative beds and two valves connected to the beds for controlling the flow through them. Each valve has two ports connected to the beds and two other ports. The valves are mechanically linked and actuated together. The valves serve to alternate two gas flows between the two beds, to effect heat and moisture transfer between the gas flows. Each valve has two valve members mounted on a common valve shaft controlling the connections between its ports.

25 Claims, 7 Drawing Sheets $T_{254a} - T_{256a}$ DURING THE OPERATING PERIOD

REGENERATIVE BED HEAT EXCHANGER

CROSS-REFERENCE TO RELATED APPLICATION

This application is a continuation-in-part of my earlier application 07/025,478 filed Mar. 13, 1987 now U.S. Pat. No. 4,708,000 granted Nov. 24, 1987.

FIELD OF THE INVENTION

This invention relates to a regenerative bed heat exchanger of a heating and ventilating system for a building. This invention more particularly relates to a heat exchanger capable of transferring both sensible heat and moisture between an exhaust air stream that includes flue gases from a space heater and an incoming air stream.

BACKGROUND OF THE INVENTION

Recently, considerable attention has been paid to energy conservation in buildings, particularly domestic housing. Both the public and the housing industry have become aware of the desirability of energy conservation. Consequently, new standard of energy efficient housing designs and construction are being developed. These standards contain stringent energy efficient requirements, with respect to thermal insulation, air tight construction, space heating, space ventilation, water heating, controlled air management and passive solar design features.

This has led to the development of the R-2000 house. The amount of energy used by space heating systems in R-2000 houses dropped to as little as 1/10 of the energy used in conventional housing units. In some energy efficient designs, the demand for supplementary heat may be so low that a furnace becomes unnecessary.

Another somewhat surprising consequence is that, since the heating requirements are considerably reduced, there is little incentive to utilize or design highly efficient furnaces for such housing. The additional cost in making the furnace or space heating unit efficient is frequently considerable, but since the heating costs are in any event low, the economic savings from reduced fuel consumption may not be justified by the increased cost of the initial installation.

One way in which housing is made energy efficient is to make the house extremely air tight, so as to reduce leakage of heated air. However, it is now recognized that in any air tight house, provision must be made for a continuous, controlled exchange of indoor air with outdoor air, to avoid potential health and house damage problems from inadequate ventilation. In a proposed revision of the National Building Code of Canada (B. H. Dickens, "Controlled Ventilation and Housing", A Summary Review, 008-T5, Energy, Mines & Resources Canada, December, 1985), it is specified that a mechanical ventilation system must be provided, whether or not provision is also made for natural ventilation. In other words, reliance on natural ventilation is no longer acceptable. It is required that the mechanical ventilation system must have a minimum capacity of 0.5 ACH (Air Changes per Hour) for houses where natural ventilation for summer cooling is provided. In the absence of the capability for summer cooling, the capacity is required to be 1.0 ACH. The mechanical ventilation is required to be independent of any natural ventilation sources such as infiltration and flow through windows.

Currently, for energy efficient or R-2000 houses, the space conditioning services are provided by conventional space heating systems coupled with conventional ventilating systems and air-to-air heat recovery systems.

A variety of space heating systems are employed. For central systems, the energy source may be natural gas, oil or electric power, and the furnace may be conventional, high efficiency or an ultrahigh efficiency condensing type.

The ventilation of an R-2000 home is usually combined with recovery of heat from the exhausted air in a standard air-to-air heat exchanger equipped with defrost controls. At present, various types of air-to-air heat exchangers are used, with various effectiveness ratings. In a Canadian winter, at temperatures below freezing (0° C. to −20° C.), evaluation of various systems has shown the following disadvantages and loss of effectiveness:

(1) In solid core systems, of various materials, and both counterflow or double crossflow, severe frost buildup can cause up to a 50% drop in sensible heat recovery effectiveness and up to a 16% leakage of exhausted air into the fresh air supply and a significant drop in air delivery capacities;

(2) For current heat wheel concepts, severe frost buildup reduces sensible heat recovery effectiveness up to 22%, air delivery capacities are reduced by up to 34% and the leakage of the exhaust air into fresh air is up to 30%;

(3) For current heat pipe systems, measured sensible heat recovery effectiveness was in the range from 47–55%.

A major problem with existing air-to-air heat exchangers is the buildup of ice on the heat transfer surfaces affecting the heat transfer efficiency and air flow capacity. This depends on air stream temperatures and humidities, together with duration of the period of freezing and the system's design. For current air-to-air heat recovery systems, buildup of ice starts at temperatures below 26° F., although options for control of freeze-protection systems have been reported.

If one considers the requirements for space heating and ventilation of R-2000 houses, due to the high degree of the energy efficiency, the heating requirements are low. Thus, by way of example, for a 155 m² typical two storey house in a 6000 D.D. zone with 150 heating days per year, the average heat consumption would be 7,347 BTU/h. If one assumes a gas fired furnace which is operated for 50% of the time, then the required output of the furnace would be 14,695 BTU/h (which is equivalent to 94.8 BTU/h/m²).

The guidelines for R-2000 houses further specify a ventilation requirement of a minimum of 0.45 ACH, which is to be provided by mechanical means. For a 155 m² house, the ventilating capacity would then be 102 SCFM. If one assumes a 70% effective air-to-air heat recovery system, for a 75° F. indoor temperature and a 0° F. outdoor temperature, the recovered sensible heat would be about 5,878 BTU/h and the sensible heat loss in the exhausted air would be about 2,519 BTU/h.

For the R-2000 housing design, the amount of heat involved is quite small. Accordingly, for an integrated heating-ventilating-heat recovery system, emphasis should be on reduction of overall capital costs and elimination of freeze up problems associated with the operation of the air-to-air heat recovery system at freezing outdoor temperatures.

The proposed revision of the NBC calls for mechanical ventilation in all future houses regardless of the type of construction. It is anticipated that new energy efficient housing will have a considerably higher heat load requirement than houses built to the R-2000 standards. The requirement for ventilation and air-to air heat recovery will remain the same as those for the R-2000 housing.

However, the substantially higher heat load requirement for this group of new houses compared to the R-2000 housing may require that different designs be used in the two different groups of houses, even if the general requirement for conditioning of the occupied space of the two types of houses is the same.

In the heating and eentilating field, there have been numerous proposals for improvements in heating and ventilating systems, and the following U.S. patents were considered in the preparation of this application:

Re17,577 (Dryssen)
649,251 (Maude)
1,214,047 (McGinnis)
2,236,750 (Cross)
2,274,341 (Mueller)
2,497,184 (O'Brien)
2,891,774 (Theoclitus)
3,368,327 (Munters)
3,756,310 (Becker)
3,870,474 (Houston)
4,034,482 (Briscoe)
4,138,062 (Graden)
4,227,375 (Tompkins)
4,333,524 (Elkins)
4,398,590 (Leroy)
4,401,261 (Brown)

SUMMARY OF THE INVENTION

If the proposed revisions to the NBC are approved, requirements for space heating and mechanical ventilation will apply to all new housing. Consequently, air-to-air heat recovery will become an important feature in all housing.

It is desirable to provide an air-to-air heat exchanger, which improves the overall system efficiency. The system efficiency can then be improved without requiring any expensive changes to the furnace design.

In accordance with the present invention, there is provided a regenerative bed heat exchanger for exchanging heat and moisture between opposing gas streams, which comprises: first and second regenerative beds, each comprising a bed of material capable of retaining heat and moisture and two inlet/outlet openings providing communication to the bed of material; a first valve means having a first port for discharging exhaust gas to the exterior, a second port for incoming fresh air from the exterior, a third port connected to one inlet/outlet opening of the first regenerative bed, a fourth port connected to one inlet/outlet opening of the second regenerative bed, and two first valve members mounted on a common first valve shaft for controlling communication between the ports; a second valve means having a first port for exhaust gas, a second port for discharging incoming air, a third port connected to the other inlet/outlet opening of the first regenerative bed, a fourth port connected to the other inlet/outlet opening of the second regenerative bed, and two second valve members mounted on a common second valve shaft for controlling communication between the ports; each of the first and second valve shafts and associated valve members being switchable between a first position in which the first port is connected to the third port and a second port is connected to the fourth port, and a second position in which the first portions connected to the fourth port and the second port is connected to the third port; and wherein the valve shafts are mechanically linked and actuated together so that the first and second valve means are simultaneously in their first position, in which the first regenerative bed is connected to the first ports of the first and second valve means and the second regenerative bed is connected to the second ports of the first and second valve means, and are simultaneously in their second positions in which the first regenerative bed is connected to the second ports of the first and second valve means and the second regenerative bed is connected to the first ports of the first and second valve means.

The air-to-air heat exchanger is intended for use in a combined heating and ventilating system, such as that described in our copending application no.

In such a case, a fossil-fueled furnace is provided. Where the furnace heats air within the occupied space directly, then the heat exchanger can be coupled to it. Thus, incoming air, conditioned in the heat exchanger, is fed to the furnace, before being distributed through the distribution system for the occupied space. Alternatively, where the furnace heats hot water for a radiator heating system, then the incoming air from the heat exchanger can be distributed directly to the occupied space.

It is intended that the heat exchanger will economize on energy requirements in two ways. Firstly, by extracting both heat and moisture from outgoing air, sensible and latent heat are recovered. By providing a pair of beds which are used alternately, the problem of frost build up should be eliminated. Secondly, the heat exchanger enables additional heat to be recovered from flue gases from a furnace. Additionally, the flue gases from other devices within the building can be combined with the exhaust air; for example, flue gases from a hot water heater can be passed through the heat exchanger.

The regenerative bed heat exchanger of the present invention can be applied to a number of different uses. Thus, it can be applied to individual homes, multi-unit residential buildings, and industrial buildings. In each case, the heat exchanger should be sized accordingly. For use in industrial situations, consideration may need to be given to the presence of particular contaminants in the exhaust air, which may effect the regenerative bed.

BRIEF DESCRIPTION OF THE DRAWINGS

For a better understanding of the present invention, and to show more clearly how it may be carried into effect, reference will now be made, by way of example, to the accompanying drawings, which show a preferred embodiment of the present invention, and in which.

Figure 1:
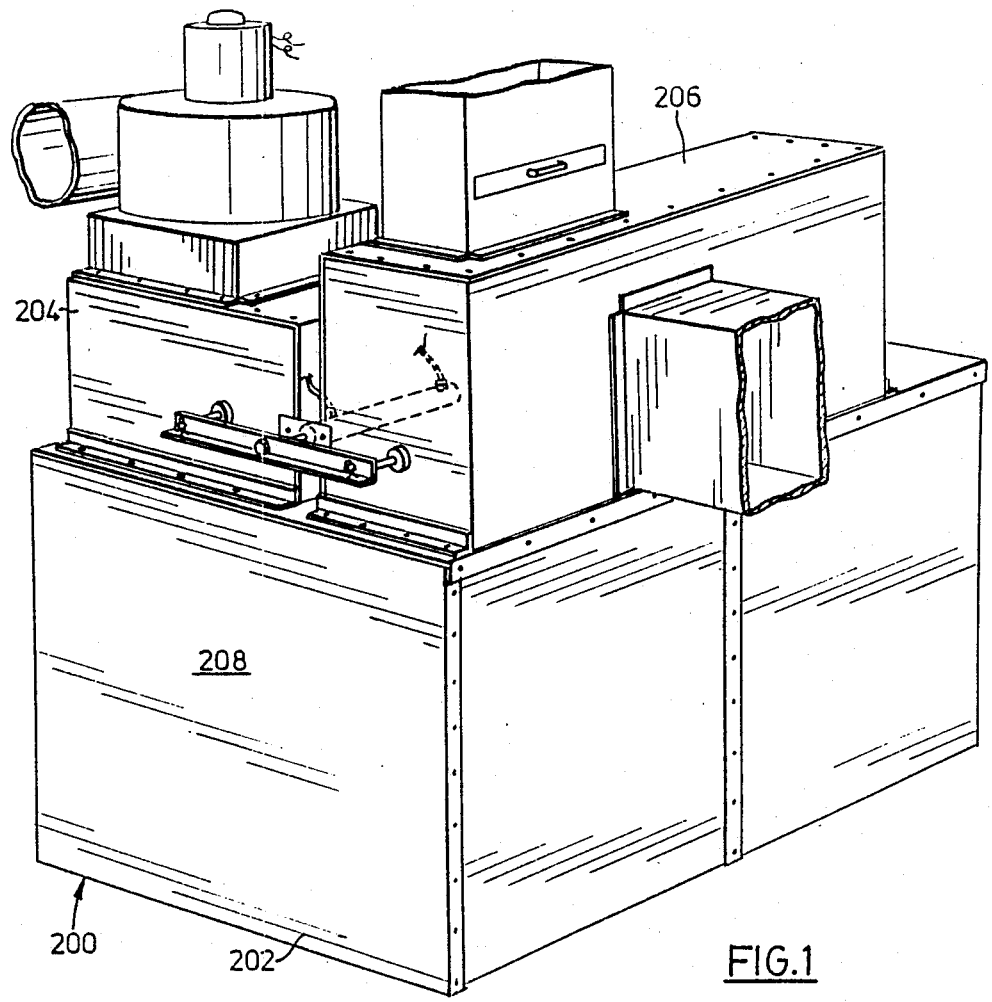
FIG. 1 is a perspective view of a regenerative bed heat exchanger according to the present invention.

The regenerative bed heat exchanger as a whole is denoted in the drawing by the reference 200. The heat exchanger 200 comprises a housing 202 for two regenerative beds. Mounted on the housing 202 are a first valve 204 and a second valve 206.

Figure 2:
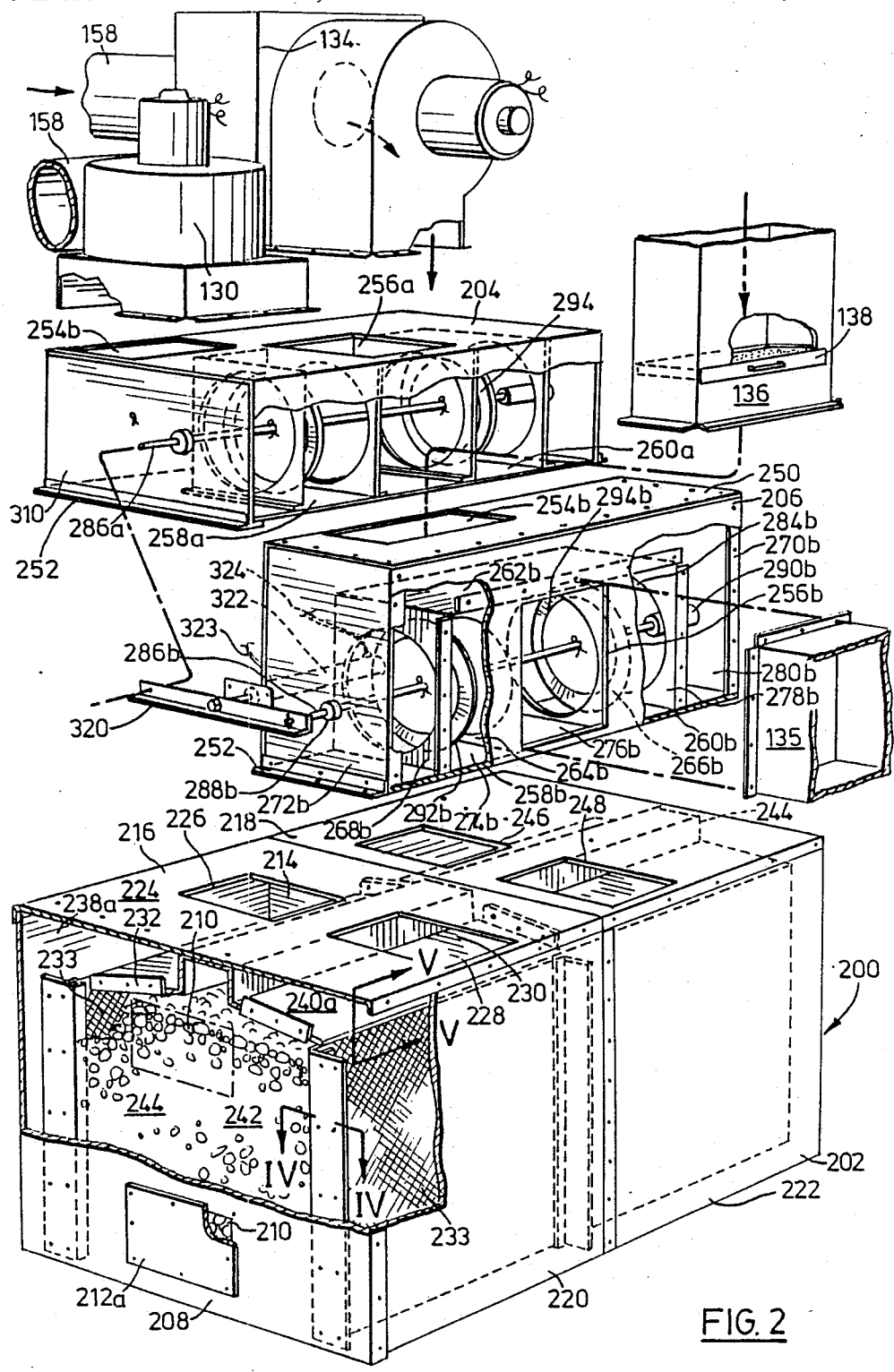
FIG. 2 is a perspective view of the heat exchanger of FIG. 1, in partial section and exploded.

The housing 200 is generally rectangular, and formed from sheet metal. The housing 200 has a front surface 208, and a corresponding back surface (not visible in the drawing). As shown in FIG. 2, the front surface 208 is provided with upper and lower apertures 210 closed by cover plates 212. The cover plates 212 can be held by screws or the like.

A bulkhead 214 divides the housing 202 into first and second containers 216, 218 for first and second regenerative beds 220, 222. The essential structure of the regenerative beds 220, 222 is similar, and is described primarily in relation to the regenerative bed 220, with the other bed 222 corresponding.

The bed 220 has a top plate 224, which is secured by screws through downturned flanges along the edge thereof. The top 224 includes one inlet/outlet opening 226, and another inlet/outlet opening 228. Both openings 226, 228 are generally rectangular.

Within the first container 216, there is a partition member 230. This partition member 230 has an inverted channel section central portion, and two sloping side portions. The sloping side parts are supported on angle section members 232 secured to the front plate or surface 208 and to the bulkhead 214.

Figure 4:
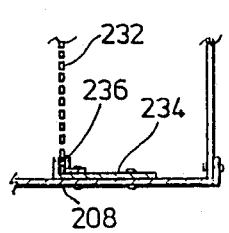
FIG. 4 is a sectional view along the line IV—IV of FIG. 2.
Figure 5:
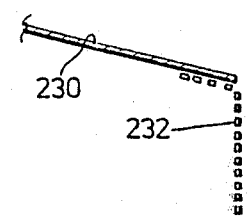
FIG. 5 is a sectional view along the line V—V of FIG. 2.

On both sizes of the container 216, there are vertical screens 233. As shown in FIG. 4, each screen 233 is secured between a major angle section number 234 and a minor angle section member 236, with both the members 234, 236 being secured to the front panel 208 or bulkhead 214. As shown in FIG. 5, te top end of the screen 233 bends under the partition member 230.

Thus, one manifold chamber 238 is defined on one side of the container by the partition member 230 and one of the screens 233. Another manifold chamber 240 is similarly defined by the other screen 233 and the partition member 230 on the other side of the container 216.

A central chamber 242 is defined by the two screens 233 and the partition member 230. This central chamber 242 is filled with a granular heat exchange material denoted by the reference 244.

The heat exchange material for the two regenerative beds 220, 222 may be of ceramic or brick pieces, stone gravel, or pebbles. Alternatively, the material in the beds can be any standard ceramic, metallic or plastic packing, such as pall rings, raschig rings, berl or intllox saddles, or tellerets. The preferred size range for the gravel or pebbles is in the range $\frac{1}{2}"$ to 1".

The second regenerative bed 222 generally corresponds to the first bed 220. For the first bed, the top plate 224 has the openings 226, 228 approximately centrally along the length of the heat exchanger 200. For the second bed 222, a top plate 244 has two openings 246, 248 located adjacent the bulkhead 214.

Like the regenerative beds 220, 222, the first and second valves 204, 206 are similar in many ways. For simplicity, like components are given the same reference numeral in both valves with the suffix "a" denoting the first valve 204 and the suffix "b" denoting the second valve 206. This applies particularly to details of the internal partitions, although the arrangement of the mounting flanges may vary. For further simplicity, the following description relates to the second valve 206 and omits the suffix "b".

The valve 206 has a housing 250, formed from sheet metal. The housing 250 is secured by angle section members 252 to the housing 202. The housing 250 has a first port 254 in its top surface, and a second port 256 in one side surface, both ports 254, 256 being generally rectangular. On its lower surface, the housing 250 has third and fourth ports 258, 260, both being generally rectangular. The third port 258 registers with the opening 228, whilst the fourth port 260 registers with the adjacent opening 248. Within the housing 250, there is an interior partition element 262, provided with flanges securing it to the side face of the housing 250 including the port 256 and including outer partitions 268, 270. Within the interior partition element 262, there are interior partitions 264, 266.

The various partitions 264, 266, 268 and 270 define a first outer compartment 272, a first inner compartment 274, and a central compartment 276. At the other end, there is a second inner compartment 278 and a second outer compartment 280. A direct connection is provided between the outer compartments 272, 280 and around the partition element 262, as indicated at 282.

Each of the partitions 264, 266, 268 and 270 has a circular valve opening 284 therein. An actuating rod 286 is slidably mounted in sleeves 288, 290 at either end of the housing 250. The sleeve 290 can be a blind sleeve.

Figure 3:
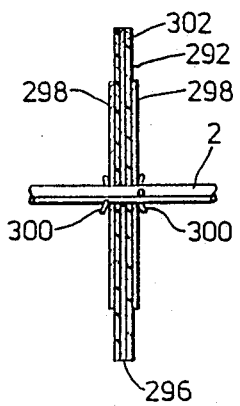
FIG. 3 is a sectional view of a valve member of the heat exchanger.

Mounted on the rod 286 are two valve or closure members 292, 294. The valve member 292 is shown in detail in FIG. 3. It comprises a central circular disc 296, with two outer and smaller discs 298. Split pins 300 in the rod 286 secure the valve member 292 in position. Around the outer periphery on either side of the disc 296, there are annular sealing members 302, which can be of a resilient material. The annular sealing members 302 are adapted to abut the periphery of the openings 284.

Thus, in use, the actuating rod 286 can be displaced, to control connections between the various ports 254-260.

With the actuating rod 286 fully withdrawn, i.e. fully to the left as viewed in FIG. 2, the valve members 292, 294 will abut the outer and inner partitions 268, 266. The first port 254 is then connected through the outer compartment 280 and inner compartment 278 to the fourth port 260. Simultaneously, the second port 256 is connected through the central compartment 276 and the inner compartment 274 to the third port 258.

When the actuating rod 286 is displaced in the opposite direction, then the valve members 292, 294 abut the partitions 264 and 270. As a consequence, the first port 254 is connected through the first outer compartment 272 and the inner compartment 274 to the third port 258. Simultaneously, the second port 256 is connected through the central compartment 276 and the inner compartment 278 to the fourth port 260.

The first valve 204 has a housing 310, generally similar to the housing 250, except that it can be considered to have been rotated through 90° about the axis of the actuating rod. The housing 310 has a first port 254a and a second port 256a both provided in its top surface. A third port 258a and a fourth port 260a are both provided in the bottom surface of the housing 310. The ports 258a, 260a are aligned with the opening 226 and the adjacent opening 246. The housing 310 is again secured by angle sections to the housing 202 of the regenerative beds.

The actuating rods 286 are connected together by a common cross member 320. A hydraulic piston and cylinder assembly 322 is mounted between the two valves 204, 206, and has connection ports 323, 324.

The regenerative bed heat exchanger of the present invention is primarily intended for use with a combined heating and ventilating system, as described in greater detail in our copending patent application no.

Figure 6:
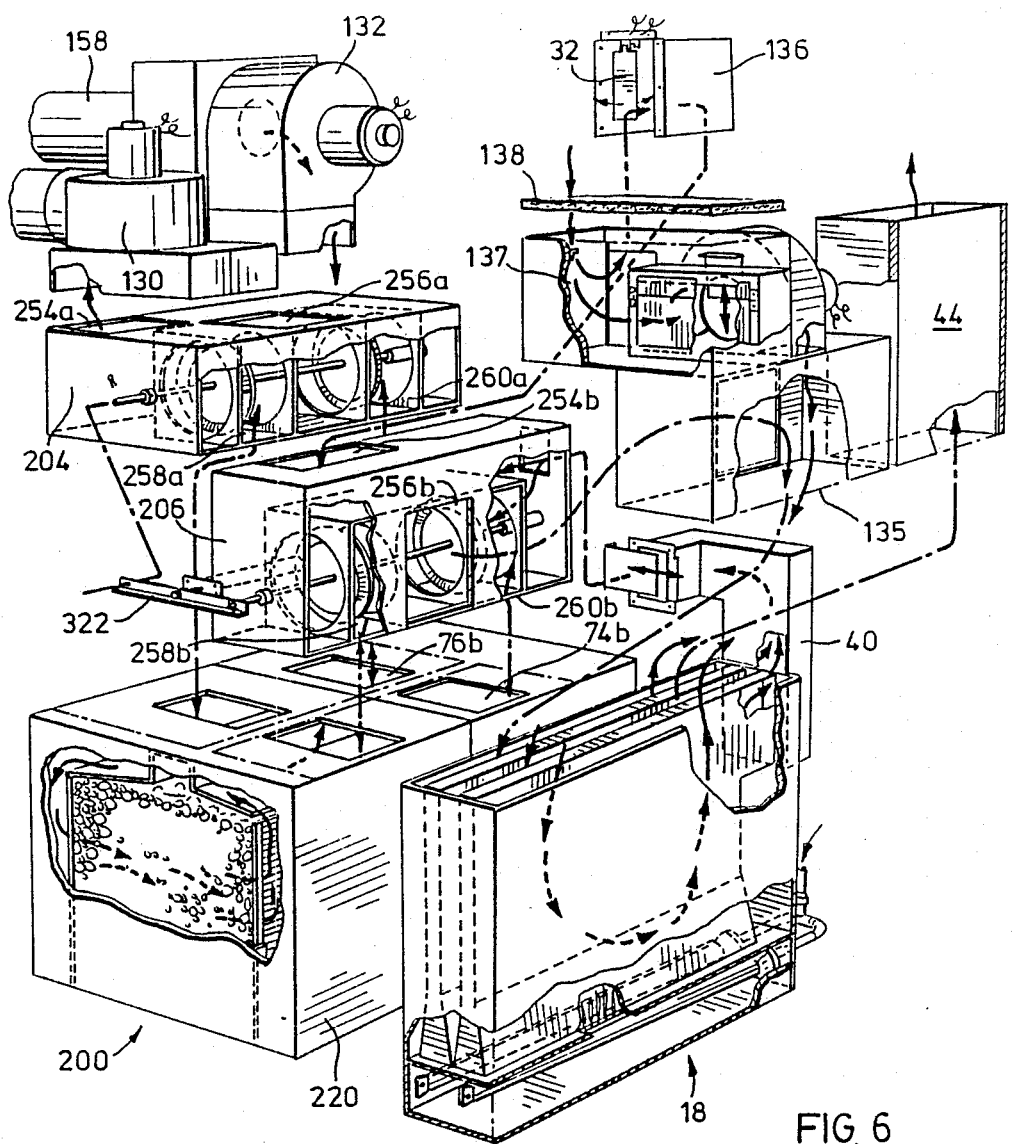
FIG. 6 is a perspective, exploded view of a heating and ventilating system incorporating the heat exchanger of the present invention.
Figure 7:
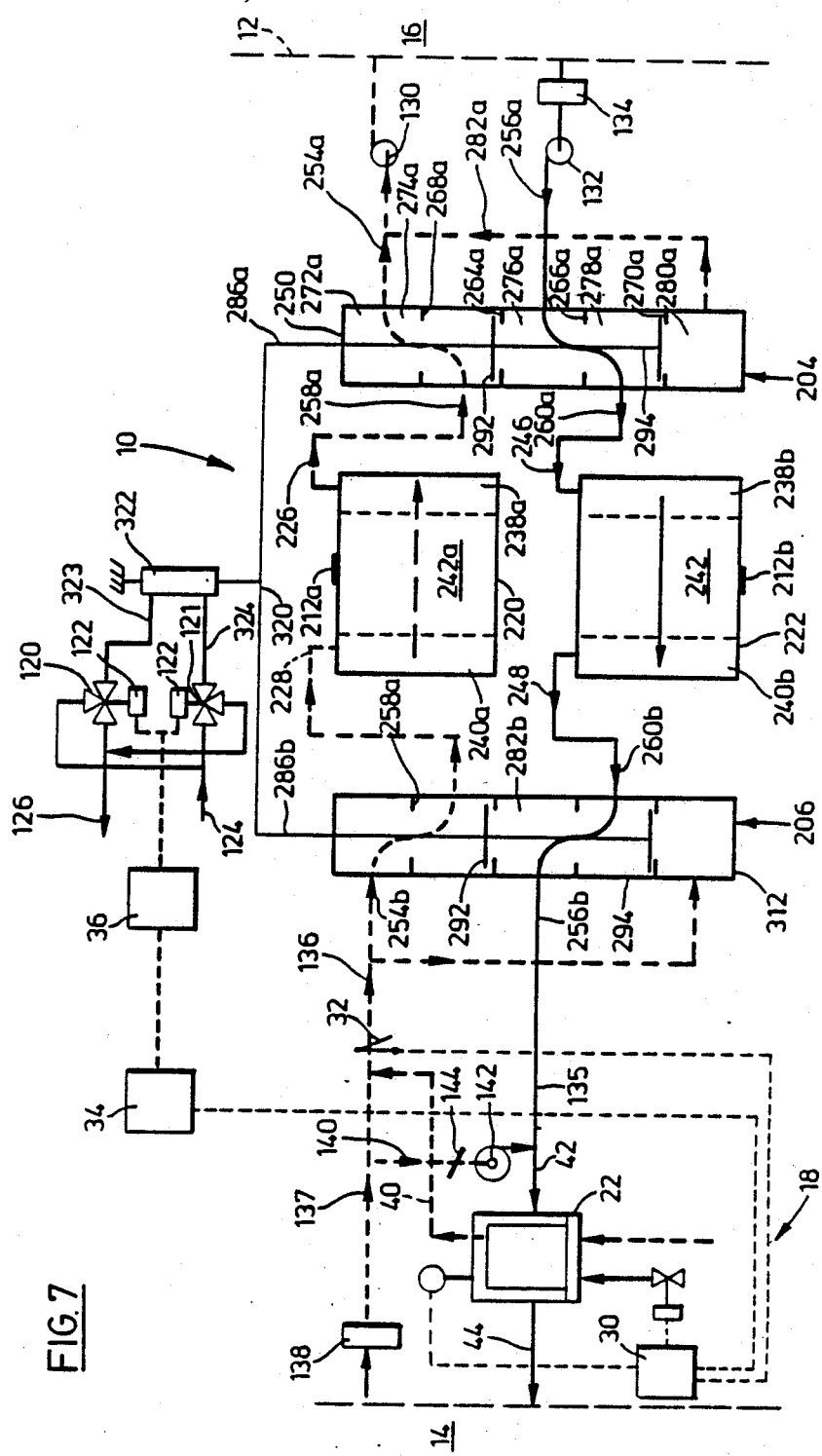
FIG. 7 is a schematic diagram of the heating and ventilating system of FIG. 6.

A schematic of such a combined heating and ventilating system is shown in FIG. 7 and also in FIG. 6, and is described in outline below.

The piston and cylinder assembly 322 has each of its inlet ports 323, 324 connected to a respective three-way valve 120, 121. Actuators 122 for the valves 120, 121 are connected to the solid state control unit 36. An inlet line 124 for a pressurized operating fluid is connected to a port of each valve 120, 121. Similarly, an outlet line 126 is connected to a port of each of the valves 120, 121.

The piston and cylinder assembly 322 can be driven by any suitable hydraulic fluid source. Thus, the lines 124, 126 can be connected respectively to the output of a hydraulic oil pump and a hydraulic oil reservoir. For simplicity, the cylinder 322 could be driven by tap water, relying upon the pressure of the water to provide the necessary force. The water exhausted from the cylinder 322 would then simply be drained away.

The essential requirement for the cylinder 322 is that the valve or closure members 292, 294 are moved fully between the respective partitions, and that at the end of the movement, a sufficient force is maintained to keep the closure members 292, 294 abutting the necessary partitions.

In FIG. 7, the closure members 292, 294 are shown abutting the partitions 264, 270. In this position, a pressure is maintained at the inlet port 323 of the hydraulic actuator 322. To move the closure members, the inlet port 323 is connected by its valve 120 to the discharge line 126. Simultaneously, the inlet line 124 is connected by the valve 121 to the inlet port 324. This causes the actuating rods 286, together with the closure members 292, 294, to travel upwards, as viewed in FIG. 7. (In FIG. 2, the corresponding movement is to left, but note that the position of the cylinder 322 is reversed in FIG. 7.) The closure members 292, 294 are then urged against the partitions 268, 266.

A recirculation line 140 is provided between the return air line 137 and the heater inlet 42. The recirculation line 140 includes a third, recirculation blower 142 and a damper or non-return valve 144. The non-return valve 144 only permits air flow from the line 137 to the heater inlet 42.

The electronic solid state control unit 36 includes a variable solid state ON OFF timer and relays interconnected with the combustion controls 30. The actual circuits of these components, and the relays, are not given in detail, since they can be largely of known construction and a variety of different circuits can be used. The cycle time for the valves 204, 206 can be varied in the range of, for example, 1–100 minutes.

The cross-sectional flow area of the beds 220, 222 is selected to provide an acceptable pressure drop, which in turn depends upon the gas velocities. The frontal gas velocities of the entering air streams are preferably in the range 100–300' per minute. The depth and overall size of the beds 220, 222 is selected to give the desired thermal effectiveness, and depends on the flow rate, temperature and humidity of the incoming air and on the duration of the operating cycle.

As shown in FIG. 6, blowers 130, 132, which are centrifugal blowers, are mounted on top of the housing 310. The duct work connecting the blowers 130, 132 to the exterior 16 is indicated at 158.

The housing 250 can define a smaller opening 160 at one side (FIG. 6). This opening 160 provides connection for an exhaust conduit 40 from a space heater or furnace 22.

As shown in FIG. 7, a return air line 137 and an exhaust air line 136 are connected to the port 254b. The line 137 includes a filter 138. A line 135 extends between the port 256b and the heater 22, which includes an outlet 44. The outlet 44 and return air line 137 are both connected to the occupied space 14.

The various air ducts or conduits can be constructed of steel or other suitable material. They should be of a large enough flow area to minimize flow resistance. Similarly, in known manner, they should be insulated where appropriate. In particular, the exhaust conduit 40 from the heater 22 can be insulated. The heater inlet and outlet 42, 44 would be connected to a standard distribution network within a house. Thus, the outlet 44 would be connected to a number of distribution outlets throughout the house, whilst the inlet 42 would be connected to a, usually, smaller number of air return inlets.

The heating and ventilating system just described can be used either in a heating mode as an energy efficient balanced heat recovery ventilator/heater, or in a ventilating mode as a highly energy efficient balanced heat recovery ventilator. The description of these modes of operation are given in our copending application mentioned above. Below, the behaviour of the regenerative beds 220, 222 is described.

The exhaust blower 130 draws a combination of exhaust air and combustion products through the exhaust line 136. The mixture of exhaust gases is then drawn into and through the valve 206 and inlet/outlet opening 228 into the manifold chamber 240a. The air then passes through the screen 233 and horizontally through the packed bed in the central chamber 242a, and into the manifold 238a. The air leaves through inlet/outlet opening 226 and passes through the first valve 204 and through the first port 254a to the exhaust blower 130. Finally the air is forced by exhaust blower 130 out to the exterior 16.

Simultaneously, the cool outdoor air is drawn by blower 132 through the filter 134, and then forced via second port 256a into and through the 4-way valve 204. The air then flos via the inlet/outlet opening 246 into the manifold chamber 238b, then through the screen 233, horizontally through the packed bed in the central chamber 242b, through the other screen 233 into the manifold chamber 240b, and then out through the inlet/outlet opening 248. The air then passes through valve 206, to the incoming air line 135.

During the time the actuating rods 286a, 286b remain in the position of FIG. 7, the bed 220 is being heated by absorbing heat from the exhausted mixture of stale air and combustion products which mixture in turn is being cooled from a higher entering temperature to a lower exiting temperature. The heated packed bed material has the highest temperature adjacent the manifold chamber 240a and the lowest temperature adjacent the manifold chamber 238a.

Simultaneously, the bed 222 is being cooled by the cool fresh air flowing horizontally through it and countercurrently with respect to flow of exhausted stale air. As the bed 222 is releasing the previously absorbed heat and moisture, the fresh air is humidified ad heated from its low entering temperature to its highest temperature at which it exits from packed bed 222.

Thus, the bed 222 is coldest adjacent the manifold chamber 238b and warmest near the manifold chamber 240b.

During the described period, when the bed 220 is being heated and packed bed 222 is being cooled, the temperature of the cooled exhausted air leaving packed bed 220 is slowly rising, while the temperature of the heated fresh air leaving the heated bed 222 is slowly dropping. These temperature swings can be controlled by the duration time of the operating cycle. Consequently, by controlling the duration time of the operating cycle one can control the temperature of the exhausted air leaving the packed bed heat exchanging material and thus prevent the buildup of ice in the regenerative beds 220, 222.

When the actuating rods 286a, 286b move from the position shown in FIG. 7 into a position where the valve members 292, 294 abut the partitions 266, 268, then the two air streams are switched between the two beds 220, 222. The mixture of exhausted stale air and flue gases now is drawn through the regenerative packed bed 222 while the cool fresh air is now forced through the bed 220. The previously heated bed 220 now gives up its heat and moisture to the incoming air stream. The previously cooled bed 222 now is heated and absorbs moisture from the exhausted air. Thus eventually an operating cycle of heating and cooling for each of the two packed bdds 220, 222 is completed. The two halves of the operating cycle are of equal duration. Since changing the position of the two actuating rods 286a, 286b between their end positions takes only a fraction of a second, the flow of the two air streams is essentially continuous. Since the exhausted stale air and flue gases during the heating period flow through packed beds 220, 222 countercurrently relative to flow of the fresh air during the cooling period, the heat and moisture transfer between the two air streams is perfectly countercurrent.

Since the mixture of stale air and combustion products flows through the apparatus under negative pressure induced by the exhaust blower 130, while the fresh air is forced through the apparatus under positive pressure by the blower 132, contamination of the fresh air with combustion products due to potential leaks is virtually eliminated. When the flow is switched between the beds 220, 222, a residual amount of exhaust air will be stored in on bed and then entrained in the fresh air coming in through that bed. Compared to the total volume of air passing through the regenerative beds 220, 222, this residual quantity of exhaust air is negligible, and any flue gases are heavily diluted by exhausted stale air.

Figure 8:
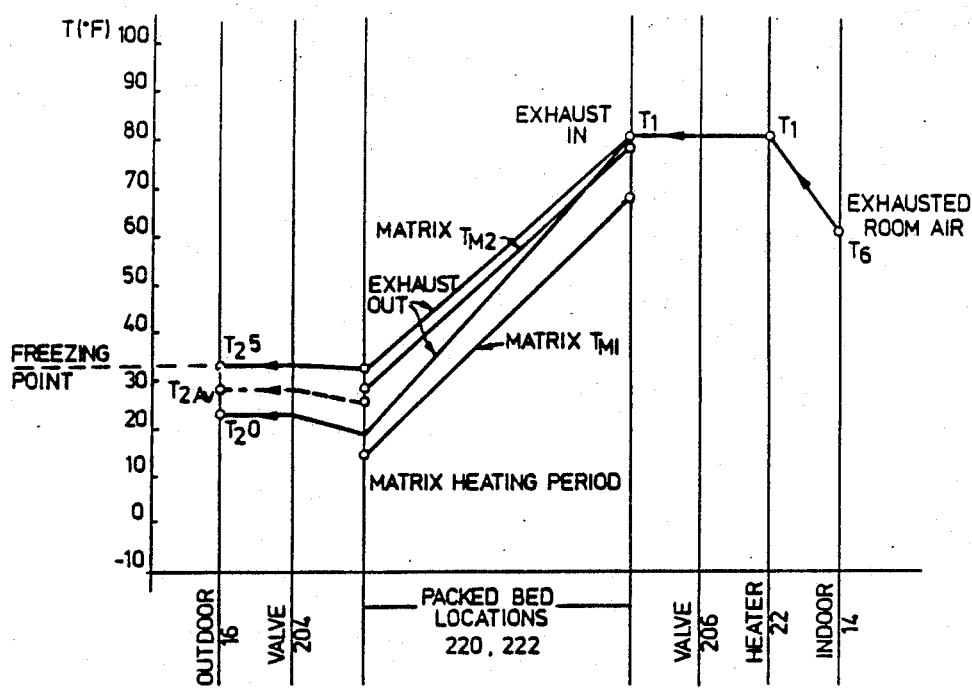
FIGS. 8 and 9 show graphs of temperature variations in the heat exchanger during cooling and heating periods.
Figure 9:
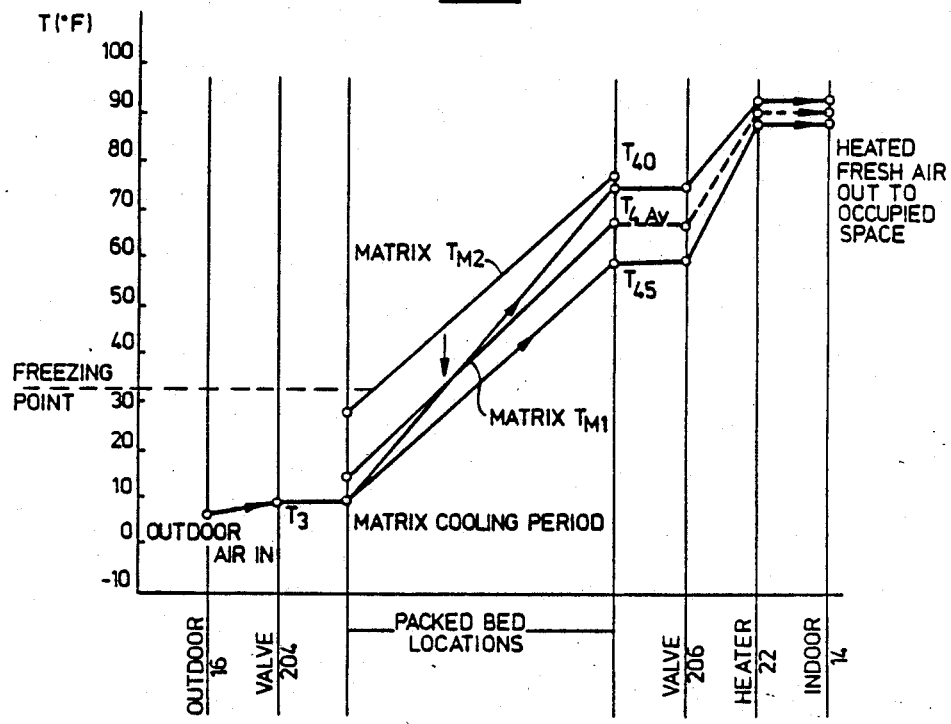

Reference will now be made to FIGS. 8 and 9, which show the variation of the temperature in the beds during both heating and cooling. These results are based on a run carried out on Jan. 27, 1986.

Referring first to FIG. 8, this shows heating of the material in the regenerative bed 220, or 222; in other words, the outgoing air is giving out both heat and moisture to the bed. The temperature within the bed is time dependent. The temperature of the granular material of the regenerative bed at the start of the heating period is indicated as matrix $T_{M1}$. A temperature slope across the bed is generally maintained as it is heated, and at the end of the heating period, the bed temperature profile is indicated by matrix $T_{M2}$.

During heating, indoor air from the occupied space 14 is exhausted at a temperature T6. This is heated to a temperature T1 by the flue gases from the space heater 22. Consequently, during the heating period, exhaust gases at a constant temperature T1 pass through the valve 206 to the respective regenerative bed.

Thus, the temperature difference at te input to the regenerative bed is high at the beginning of the heating period and decreases. At the outlet or exhaust side of the bed, the output temperature is T20, and this increases to T25 during the heating period, so that the temperature difference does not vary greatly at the output side. The average output temperature is indicated at T2AV.

FIG. 8 shows the measured temperatures for a 5 minute heating period, during a 24 hour continuous run. During the operating period, the average temperature of the discharge moist air T2AV was 28° F.

Simultaneously with heating of one regenerative bed 220, 222, the other regenerative bed is being cooled, and giving out heat and moisture to the incoming fresh air. This is shown in FIG. 9, again for a 5 minute cooling period. During the cooling period, the fresh air enters the packed bed at a constant temperature T3, which is below the initial temperature of the packed bed material $T_{M2}$. The air is discharged from the regenerative bed at an initial temperature T40, which is below the initial temperature of the packed bed $T_{M2}$. Again, during cooling, the temperature profile in the bed changes from matrix $T_{M2}$ to matrix $T_{M1}$. Correspondingly, the temperature of the discharged heated air drops to T45 at the end of the cooling period. The average temperature $T_{4AV}$ is indicated. Again, subsequent heating in the heater 22 before discharged to the occupied space 14 is indicated.

As shown in FIGS. 8 and 9, the temperature of the regenerative bed material on the cold side of the bed during the two operating periods remained below the freezing point with the temperature $T_{M2}$ at about 27° F. and the temperature $T_{M1}$ at about 14° F. Both temperatures $T_{M1}$, $T_{M2}$ were substantially below the dew point of exhausted moist air.

The heat transfer mechanisms involved are those for sensible heat transfer and latent heat transfer, which involve quite different mechanisms. The transfer of moisture and latent heat may involve two mechanisms, one involving adsorption-desorption and the other involving condensation-evaporation. As the packed bed material does not possess the required adsorption properties, moisture transfer is almost exclusively by condensation-evaporation. This requires the temperature of the bed material at the cold side to be significantly below the dew point temperature of the moist air and the air has to be relatively humid. Condensation then requires that fine particles of condensed moisture be formed in the air. Some of these are attracted by mechanical forces to the surface of the packed bed material, whilst the remainder are discharged in the air. This particle separation mechanism means that the moisture effectiveness may not be related to the heat transfer effectiveness. Thus, the efficiency coefficients $E_{XS}$ for the sensible heat transfer effectiveness and $E_{XL}$ for the moisture transfer effectiveness may be substantially different.

When operating in winter conditions, with outdoor temperatures below freezing, the moisture condensing in the regenerative beds can form ice. This is shown in FIGS. 8 and 9, where the temperature at the cold side of the bed is constantly below freezing.

Accordingly, the timing for the cycle for the regenerative beds 220, 222 should be chosen to ensure that no continuous ice build up occurs in the regenerative beds. For some applications, this could mean ensuring that the cycle is sufficiently long for the whole of the bed to be heated above freezing. This would than cause any ice that formed on the bed during the cooling period to be melted during the heating period. The moisture can then be re-evaporated during the next portion of the cycle to humidify the incoming air.

In the example given in FIGS. 8 and 9, whilst the temperature of the cold side of the regenerative bed remain below freezing, no excessive ice build up was noticed. Any ice formed during the matrix heating period was given out during the cooling period.

For the situation in which the flow of the two air streams through the two beds 220, 222 is balanced, the sensible heat transfer effectiveness of the regenerative heat exchanger is a function of only two dimensionless parameters:

$$E_{XS} = (N_{TU}, C_r/C_{min})  \quad 47$$

where:
$N_{TU}$=number of heat transfer units of packed bed
$C_r$=packed bed material heat capacity rate (BTU/h° F.)
$C_{min}$=heat capacity of the smaller air stream=$W_2$=$W_3$ (BTU/h° F.)
Experimental data for one unit were correlated by a function $$E_{XS} = 1 - 1/(1 + N_{TU}(C_r/C_{min})0.08)$$

where:
$N_{TU} = A_T U/C_{min}$
$A_T$=total surface area of packed bed material (ft²)
U=overall heat transfer coefficient (BTU/ft²h° F.)
Experimental data also indicates that U is also affected by the operating cycle time so that the experimental data can be also correlated by:

$$E_{XS} = 1 - 1/(1 + KA/J^{\frac{1}{2}})$$

where:
K=a constant for the specific dimensions of the packed bed
A=surface of the used packed bed material
J=operating time for the heating period
This last equation show the dependence of the $E_{XS}$ on the surface area of the material and on the length of the heating period. It can be seen that by increasing the ratio $A/J^{0.5}$, $E_{XS}$ will increase, which implies that increasing the surface area of the packed bed and reducing the time of the heating period will increase the $E_{XS}$ of the heat exchanger. It also implies that (1) by using more efficient packed bed material, the size of the packed bed can be reduced, (2) by operating the heat exchanger in a short operating cycle, $E_{XS}$ will increase and (3) by operating the unit at long cycles, $E_{XS}$ will be reduced.

Considering the moisture transfer effectiveness, since the packed bed material does not possess adsorption properties, moisture can be collected on the surfaces of the packed bed material only when the material temperature falls below the dew point of the discharged moist air. Since in this particular case, the moist air comprises the exhausted indoor air and the flue products, the dew point of moist air depends on the humidity of the indoor air and on the heat input to the air heater, required by the heating load.

Since during winter conditions, outdoor temperatures may drop much below the freezing point, the temperatures of the packed bed on the cold side of the bed will also be at temperatures below freezing. It then can be appreciated, that when the moist air is cooled below its dew point by contacting the cold packed bed material, condensation of air moisture will occur due to contact of the moist air with the packed bed material and also due to mixing of the cooled air from the boundary surrounding the particles of the packed bed with the moist air of the air stream flowing through the channels created by the packed bed material. Fine particles of moisture will be therefore formed both on the surfaces of the packed bed material and in the bulk moist air. At temperatures below the freezing point these moisture particles will solidify forming ice. Those formed in contact with the subcooled packed bed material will be retained by the packed bed material. Those formed in the bulk air will be split into two portions; one stream, through an impingement mechanism, will reach the bed surface and will be retained by the bed material, the other will be discharged with the bulk air out of the packed bed. Since the temperature of the discharged moist air increases during the heating period and since the duration of the heating period can be adjusted by the cyclic timer, it is possible to chose the length of the heating period such that for any low outdoor air temperature, the temperature of the discharged moist air at the end of the heating period will be above the freezing point. Under such longer operating periods, the solidified particles of condensed moisture retained by the packed bed material at the beginning of the heating period, will melt at the end of the heating period and will be re-evaporated into the dry cold air in the subsequent cooling period. In this manner, a portion of the moist air moisture will be transferred to fresh air and recycled back into the occupied space.

This behaviour was noticed during the winter months of 1985/86. The typical temperature profiles are shown in FIGS. 8 and 9. During 24 hours of continuous operation of the unit there was no evidence of ice buildup on the cold sides of packed beds. Because of discrepancies experienced in measured humidities and unbalanced flow of the two air streams, collected data at low outdoor temperatures are not complete and precise conclusions with respect to moisture transfer effectiveness under very low temperature conditions as yet can not be made.

Figure 10:
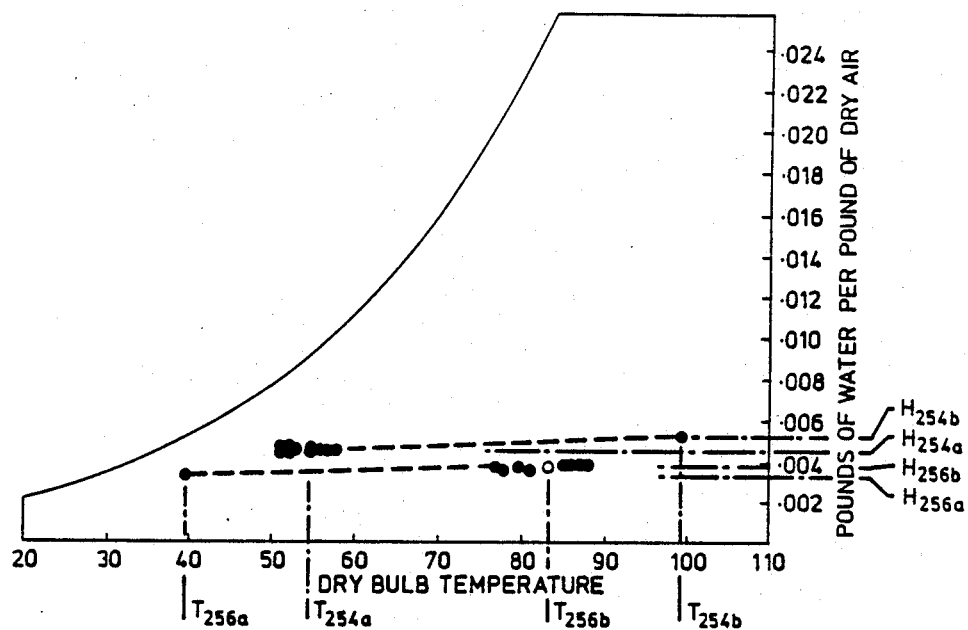
FIGS. 10 and 11 show the temperature humidity of the hot and cold streams for low and high humidities.
Figure 11:
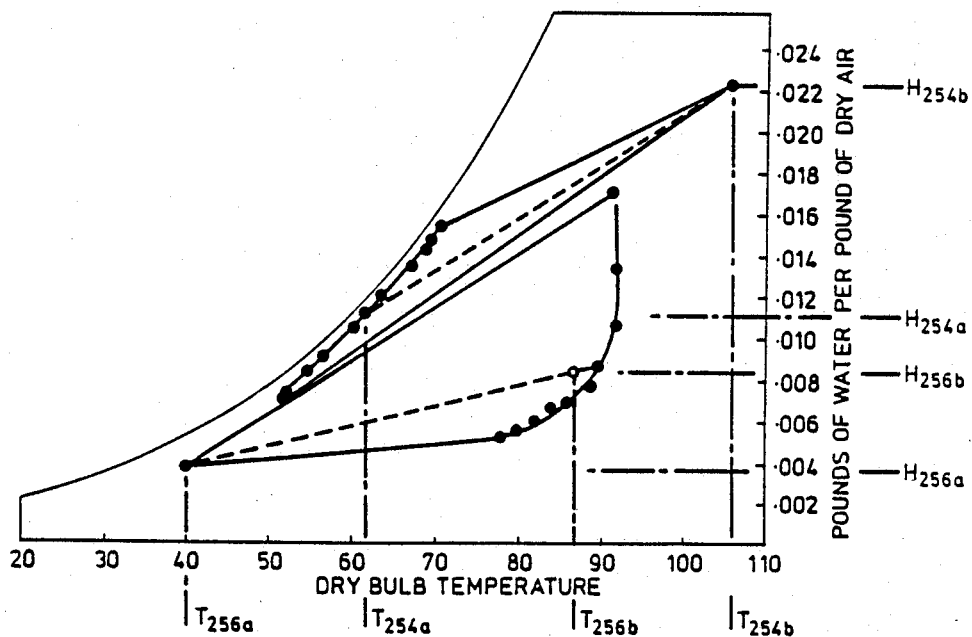

During runs with high humidity levels, it was found that the moisture transfer effectiveness is strongly affected by the air humidity. FIGS. 10 and 11 show graphs of typical operating conditions for the two air streams through the regenerative beds during heating-cooling periods for low and high dew point air. The reference numerals used for the relevant ports are used to designate the temperatures and other parameters present at that port. Thus, T254$b$ is the temperature at the first port 254$b$ of the valve 206.

For low dew point air, as shown in FIG. 10, when the sensible heat transfer effectiveness was $E_{XS}=0.77$, the moisture transfer effectiveness was only $E_{XL}=0.250$. As shown in FIG. 10, the moisture content of the exhausted air H254A was only slightly less than the moisture content H254B of the exhaust air flowing to the regenerative bed. Even though the temperature was reduced from approximately 100° F. to 55° F., the relative humidity did not exceed 60%. Both these figures were around 0.005 lbs. of water per lb. of dry air. Correspondingly, the incoming air was humidified from a moisture content of H256A to H256B; this representing a small increase in moisture content in a narrow range between the levels of 0.003 and 0.004 lbs. of water per pound of dry air. The incoming air was heated from 40° F. to around 85° F.

For high dew point air, the moisture transfer effectiveness was more than doubled to $E_{XL}=0.61$. Such a difference in moisture transfer effectiveness can only be explained through the existence of a particle impingement mechanism discussed above. This is shown in FIG. 11. As can be seen, the exhaust air supplied to the regenerative bed in the heating period had a humidity of H254$b$. Here this represented approximately 0.0225 lbs. of water per lb. of dry air at a temperature of 106° F. At the start of the heating eriod, this was reduced to a moisture content at the port 254$a$ of approximately 0.007 lbs. of water per lb. of dry air at 52° F. As the bed ws heated up, less moisture was given out to it, and at the end of the heating period, the moisture content of the air leaving the bed was approximately 0.0157 lbs. of water per lb. of dry air at 71° F. The average moisture content of the exhausted air from the bed is indicated at H254$a$, a value of approximately 0.011 lbs. of water per lb. of dry air at 62° F. It will thus be seen that a substantial quantity of water was given up to the regenerative bed, and that the exiting gases were always close to saturation.

During the subsequent cooling period, the heat and moisture are given out to the air. As shown, the cooling air entered the bed at a moisture content of H256$a$ of approximately 0.0038 at a temperature of 40° F. Initially, the relatively hot bed increased the moisture content of the discharged fresh air at port 256$b$ to a value of approximately 0.017 lbs. of water per lb. of dry air. This was at a temperature in excess of 90° F. By the end of the period, the air leaving port 256$b$ had a moisture content of approximately 0.005, and a temperature below 80° F. The average moisture content of the discharged air H256$b$ was approximately 0.0084, at a temperature T256$b$ of approximately 87° F. It can thus be seen that there was effective transfer of moisture and latent heat. By contrast with FIG. 10, it can be seen that, because of the initial high moisture content of exhausted air, it is cooled to saturation; for low hmmidity air, even after cooling, the exhausted air only had a relative humidity of approximately 50%, averaged over the duration of the heating period.

Figure 12:
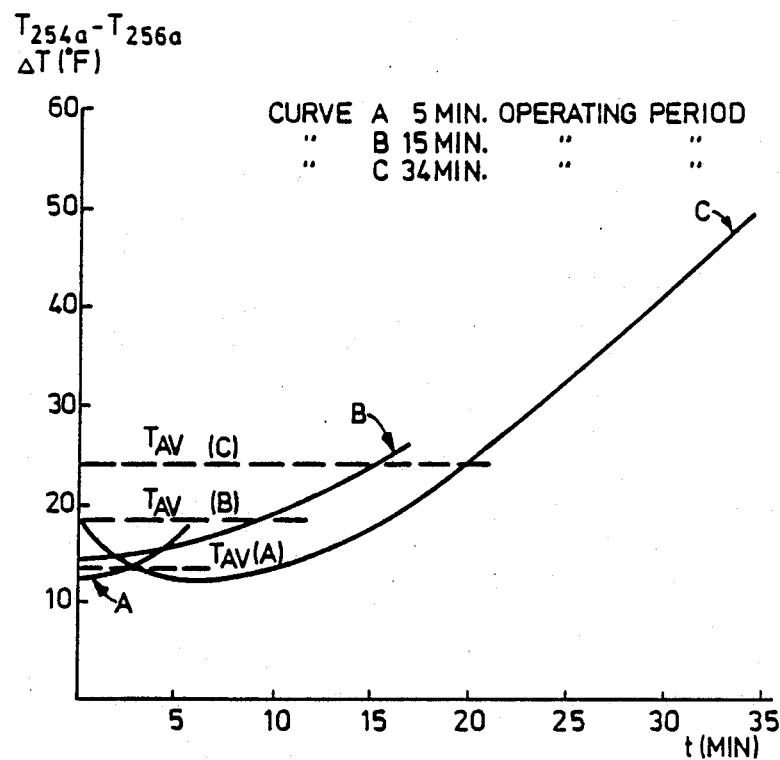
FIG. 12 shows curves for the instantaneous temperature difference between discharged and incoming air streams for different operating periods.

FIG. 12 shows the variation of the difference between T254$a$ and T256$a$; this is a measure of the effectiveness of the heat exchange. FIG. 12 shows this variation as a function of time for different operating periods. The curves A, B and C show the variation for 5, 15 and 34 minute operating periods. As can be seen, for the 5 minute period, the initial temperature difference is the smallest, but it rises rapidly. For the 15 minute operating period, the temperature difference initially is slightly higher, and arises at a generally lower rate, to a final higher difference. This behavior is to be expected, and corresponds to FIGS. 10 and 11; as the temperature of the bed cooling the exhausted air rises, the exhaust air temperature rises during the period. However, for curve C, the initial temperature difference is relatively high, and this drops rapidly during, approximately, the first 5 minutes, suggesting that the heat transfer rate from the exhaust air is increasing during this period. During the remainder of the time, again as the respective bed heats up, the temperature of the exhausted air will rise, so that the temperature difference increases. Ultimately, at the end of the 34 minute period, the temperature difference is in excess of 40° F.

From the shape of these curves, it is evident that by controlling the operating cycle time, one can control the temperature conditions in the packed bed. Ice build up on the surfaces of the packed bed material can therefore be prevented, even at sub-zero outdoor temperatures.

For the combined heating and ventilating system, the amount of moisture remoed from the occupied space is a complex function of the ventilation rate, indoor and outdoor humidities, fuel input and moisture transfer effectiveness of the air-to-air heat exchanger. It increases with increase in the ventilation rate, with increasing indoor humidity and with reducing outdoor humidity and fuel input.

During winter conditions, the indoor air humidity is low. For R-2000 homes, since the heat requirement is small, the dew point of the moist air drawn through the packed bed material is expected to be low. Under such conditions, the moisture transfer effectiveness of the packed bed regenerative heat exchanger is also expected to be Iow enough, to permit enough moisture removable to maintain the indoor air humidity at desirable levels.

Two packed bed heat exchanging materials were tested in a model of the combined heating and ventilating system. These were ¾" limestone gravel and ¾" stone pebbles. The stone pebbles were found to be significantly more effective than the limestone gravel. These stone pebbles gave a higher heat exchange efficiency.

I claim:

1. A regenerative bed heat exchanger for exchanging heat and moisture between opposing gas streams, which comprises: first and second regenerative beds, each comprising a bed of material capable of retaining heat and moisture and two inlet/outlet openings providing communication to the bed of material; a first valve means having a first port for discharging exhaust gas to the exterior, a second port for incoming fresh air from the exterior, a third port connected to one inlet/outlet opening of the first regenerative bed, a fourth port connected to one inlet/outlet opening of the second regenerative bed, and two first valve members mounted on a common first valve shaft for controlling communication between the ports; a second valve means having a first port for exhaust gas, a second port for discharging incoming air, a third port connected to the other inlet/outlet opening of the first regenerative bed, a fourth port connected to the other inlet/outlet opening of the second regenerative bed, and two second valve members mounted on a common second valve shaft for controlling communication betwenn the ports; each of the first and second valve shafts and associated valve members being switchable between a first position in which the first port is connected to the third port and the second port is connected to the fourth port, and a second position in which the first port is connected to the fourth port and the second port is connected to the third port; and wherein the valve shafts are mechanically linked and actuated together so that the first and second valve means are simultaneously in their first position, in which the first regenerative bed is connected to the first ports of first and second valve means and the second regenerative bed is connected to the second ports of the first and second valve means, and are simultaneously in their second positions in which the first regenerative bed is connected to the second ports of the first and second valve means and the second regenerative bed is connected to the first ports of the first and second valve maans.

2. A heat exchanger as claimed in claim 1, wherein each regenerative bed includes two manifold chambers and a central chamber between and in communication with the two manifold chambers, with said bed of material contained within the central chamber and each manifold chamber including one inlet/outlet opening.

3. A heat exchanger as claimed in claim 2, wherein each manifold chamber is separated from the adjacent central chamber by a perforated screen.

4. A heat exchanger as claimed in claim 3, which includes a common housing in which the regenerative beds are provided, the central chambers being adjacent one another along an axis of the housing and the manifold chambers being adjacent one another along either side of the housing.

5. A heat exchanger as claimed in claim 4, wherein the common housing includes a top surface, in which the inlet/outlet openings are provided.

6. A heat exchanger as claimed in claim 5, which includes, for each regenerative bed, a partition member within the housing extending across the top of the respective central chamber and separating the respective manifold and central chambers from one another.

7. A heat exchanger as claimed in claim 6, wherein the partition member includes an inverted channel-shape central section secured to the top surface of the housing and two inclined portions extending downwardly from either side thereof, with the two respective screens extending vertically downwards from free edges of the inclined portions.

8. A heat exchanger as claimed in claim 1, 2 or 7, which includes access openings for the regenerative beds to enable the beds of material to be removed and cleaned.

9. A heat exchanger as claimed in claim 1, wherein each valve means comprises a respective first or second valve housing, and within the respective valve housing in the following order, a first outer compartment, a first inner compartment, a central compartment, a second inner compartment, and a second outer compartment, with the compartments separated by partitions, each of which includes a valve opening, and wherein the first port is in communication with both outer compartments, the second port is in communication with the central compartment, and the third and fourth ports are in communication respectively with the first and second inner compartments, and the valve members are located in the inner compartments with the respective valve shaft extending through the valve openings in the partitions, for closing off the openings in the partitions.

10. A heat exchanger as claimed in claim 9, wherein each of the valve penings is circular, and each valve member is circular and includes a sealing member on either side thereof.

11. A heat exchanger as claimed in claim 5, wherein each valve means comrises a respective first or second valve housing, and, within the respective valve housing in the following order, a first outer compartment, a first inner compartment, a central compartment, a second inner compartment, and a second outer compartment, with the compartments separated by partitions, each of which includes a valve opening and wherein, for each valve, the first port is in communication with both outer compartments, the second port is in communication with the central compartment, and the third and fourth ports are in communication respectively with the first and second inner compartments, and the valve members are located within the inner compartments with the valve shaft extending through the valve openings for closing off the openings in the partitions, and wherein the first and second valve means are located on top of the common housing of the regenerative beds with the third and fourth ports of the valve housings aligned with respective ones of the inlet/outlet openings of the regenerative beds.

12. A heat exchanger as claimed in claim 11, wherein each valve housing includes a respective inner partition element with a direct connection from one outer compartment to the other outer compartment being defined between the inner partition element and the respective valve housing, and wherein the first valve means is orientated with the direct connection on one side and the first and second ports thereof on top of the first valve means, and wherein the second valve means is orientated with the direct connection on top thereof, with the first port provided in the top thereof, and the second port provided in the side thereof.

13. A heat exchanger as claimed in claim 11, wherein each valve opening is generally circular and each valve member is generally circular, with each valve member located in a respective inner compartment and including annular sealing members for abutting the partitions on either side of the respective compartment around the valve openings.

14. A heat exchanger as claimed in claim 13, wherein each valve member comprises a central circular disc of relatively large diameter and two discs of relatively small diameter on either side thereof.

15. A heat exchanger as claimed in claim 14, wherein each valve member includes, on either side, an annular sealing member.

16. A heat exchanger as claimed in claim 14, wherein each valve member includes, on either side, an annular sealing member and includes a hole through which the respective valve shaft extends and is retained on that valve shaft by retaining means, and wherein each valve shaft is slidably mounted in sleeves at either end of the respective valve housing.

17. A heat exchanger as claimed in claim 9 or 11, wherein the first and second valve means are located side by side with free ends of the valve shafts extending out from the first and second valves in the same direction, and which includes a cross member mechanically linking the free ends of the valve shafts and a hydraulic actuator secured between the first and second valve means and connected to the cross member for actuation thereof.

18. A heat exchanger as claimed in claim 11, wherein the first and second valve means are located side by side with free ends of the valve shafts extending out from the first and second valve means in the same direction, and which includes a cross member mechanically linking the free ends of the valve shafts and a hydraulic actuator secured between the first and second valve means and connected to the cross member for actuation thereof, and a hydraulic control circuit comprising an inlet line for pressurized hydraulic fluid, a discharge line for hydraulic fluid, connection ports for the hydraulic actuator, control valves connected between the inlet and discharge lines and the connection ports of the hydraulic actuator and a control unit for controlling the control valves to control the hydraulic actuator.

19. A heat exchanger as claimed in claim 5, wherein for each regenerative bed, the bed of material comprises granular material.

20. A heat exchanger as claimed in claim 11, wherein for each regenerative bed, the bed of material comprises a granular material.

21. A heat exchanger as claimed in claim 11, wherein for each regenerative bed, the bed of material comprises: ceramic or brick pieces; stone gravel; pebbles; ceramic, metallic or plastic packing; pall rings; raschig rings, berl or intalox saddles, or tellerets.

22. A heat exchanger as claimed in claim 11, wherein the bed of material for each regenerative bed comprises grave or pebbles having a size in the range $\frac{1}{2}''$ to $1''$.

23. A heat exchanger as claimed in claim 9, which includes a first, exhaust blower mounted for driving one air stream through the heat exchanger and a second, inlet blower mounted for driving another air stream through the heat exchanger.

24. A heat exchanger as claimed in claim 23, wherein the first, exhaust blower is connected to the first port of the first valve means, and the second, inlet blower is connected to the second port of the first valve means, with the blowers being disposed for communication with the exterior, whereby a flow of exhaust air driven by the first, exhaust blower can be maintained at a subatmospheric pressure within the heat exchanger and a flow of air driven by the second, inlet blower can be maintained at a superatmospheric pressure within the heat exchanger.

25. A heat exchanger as claimed in claim 24, which includes a filter in a line connected to the first port of the second valve and a filter at an inlet of the second, inlet blower.

* * * * *